United States Patent
Slade

(10) Patent No.: US 10,502,772 B2
(45) Date of Patent: Dec. 10, 2019

(54) DEVICE OUTAGE DETECTOR INCLUDING A CURRENT DETECTOR AND A VOLTAGE DETECTOR

(71) Applicant: Grote Industries, LLC, Madison, IN (US)

(72) Inventor: Adam Broadbent Slade, Madison, IN (US)

(73) Assignee: Grote Industries, LLC, Madison, IN (US)

( * ) Notice: Subject to any disclaimer, the term of this patent is extended or adjusted under 35 U.S.C. 154(b) by 277 days.

(21) Appl. No.: 15/655,987

(22) Filed: Jul. 21, 2017

(65) Prior Publication Data

US 2018/0059161 A1   Mar. 1, 2018

Related U.S. Application Data

(60) Provisional application No. 62/381,620, filed on Aug. 31, 2016.

(51) Int. Cl.
| | | |
|---|---|---|
| *G01R 31/00* | (2006.01) | |
| *B60R 16/02* | (2006.01) | |
| *G01R 31/44* | (2006.01) | |
| *G07C 5/08* | (2006.01) | |
| *H05B 33/08* | (2006.01) | |
| *B60Q 11/00* | (2006.01) | |
| *B60Q 1/00* | (2006.01) | |
| *B60Q 1/30* | (2006.01) | |

(52) U.S. Cl.
CPC ............ *G01R 31/006* (2013.01); *B60Q 1/00* (2013.01); *B60Q 11/005* (2013.01); *B60R 16/0207* (2013.01); *G01R 31/44* (2013.01); *G07C 5/08* (2013.01); *H05B 33/0845* (2013.01); *H05B 33/0893* (2013.01); *B60Q 1/305* (2013.01); *B60Q 11/00* (2013.01)

(58) Field of Classification Search
CPC combination set(s) only.
See application file for complete search history.

(56) References Cited

U.S. PATENT DOCUMENTS

| | | |
|---|---|---|
| 5,715,093 A | 2/1998 | Schierbeek et al. |
| 9,078,328 B2 | 7/2015 | Anand |
| 9,434,308 B2 | 9/2016 | Bean |
| (Continued) | | |

OTHER PUBLICATIONS

The International Search Report and Written Opinion of the International Searching Authority dated Nov. 17, 2017 in connection with the corresponding PCT international patent application No. PCT/US2017/043609.

*Primary Examiner* — Jay Patidar
(74) *Attorney, Agent, or Firm* — Posz Law Group, PLC

(57) ABSTRACT

A device outage detector, comprising: a microcontroller; a plurality of shunt resistors, each connected to at least one of a plurality of vehicle elements; a current sensor configured to measure a plurality of instantaneous currents passing through the plurality of shunt resistors, respectively; and a voltage sensor configured to measure a plurality of instantaneous voltages across the plurality of shunt resistors, respectively, wherein the microcontroller is configured to issue a warning for a given shunt resistor if its corresponding instantaneous current is below the first threshold value and its instantaneous voltage is zero, or if its corresponding instantaneous current is above a second threshold value.

18 Claims, 4 Drawing Sheets

(56) References Cited

U.S. PATENT DOCUMENTS

| | | |
|---|---|---|
| 2006/0082332 A1 | 4/2006 | Ito et al. |
| 2012/0313545 A1 | 12/2012 | Courtel |
| 2014/0265839 A1* | 9/2014 | Anand ................. H05B 33/089 315/77 |
| 2015/0137961 A1* | 5/2015 | Bean .................... B60Q 11/005 340/431 |
| 2017/0072854 A1 | 3/2017 | Cornelius et al. |
| 2017/0109997 A1 | 4/2017 | Brooks et al. |
| 2018/0009377 A1 | 1/2018 | Troutman et al. |

\* cited by examiner

DEVICE OUTAGE DETECTOR INCLUDING A CURRENT DETECTOR AND A VOLTAGE DETECTOR

CROSS-REFERENCE TO RELATED APPLICATION

This application claims the benefit of U.S. Provisional Application No. 62/381,620 filed Aug. 31, 2016, which is expressly incorporated herein by reference.

FIELD OF THE INVENTION

This disclosure relates to a device outage detector. In particular it relates to a device outage detector that can be used to detect outages of lights or other devices along multiple branches of a harness system.

BACKGROUND OF THE INVENTION

Trailers used to haul cargo include a variety of electrical devices. In particular, they include a variety of lights that are placed for safety or legal reasons. These include tail lights, brake lights, turn lights, reverse lights, dome lights, clearance lights, side lights, etc. It is important that these lights remain functional for the operation of the trailer to be safe.

Trailer lighting can fail for a variety of reasons, however, whether that be a slow decay in the efficiency of an LED, a sudden short circuit caused by water intrusion into a lamp, or a sudden open circuit caused by a burnt-out filament or a dead LED.

For safety and legal reasons, the operator of a trailer needs to know when a failure occurs, or is about to occur.

It would therefore be desirable to provide a means for the driver to determine when a failure has occurred on one of the lights on the trailer, or when a failure is about to occur.

One solution to this problem is the use of current and voltage sensing circuit placed between a driver and a trailer that continually monitors the current and voltage on each of the lighting circuits, and alerts the operator when a fault is found.

SUMMARY OF THE INVENTION

A device outage detector is provided, including: a microcontroller; a plurality of shunt resistors, each connected to at least one of a plurality of vehicle elements; a current sensor configured to measure a plurality of instantaneous currents passing through the plurality of shunt resistors, respectively; and a voltage sensor configured to measure a plurality of instantaneous voltages across the plurality of shunt resistors, respectively, wherein the microcontroller is configured to issue a warning for a given shunt resistor if its corresponding instantaneous current is below the first threshold value and its instantaneous voltage is zero, or if its corresponding instantaneous current is above a second threshold value.

The vehicle elements may be lights.

Each shunt resistor may be connected to one of a plurality of branches of a wiring harness leading to at least one of the plurality of vehicle elements.

The voltage sensor may be a voltage divider.

The first threshold value may be equal to a moving average current minus an adjustment value.

The adjustment value may vary with each shunt resistor.

The adjustment value may be less than a current draw of the least demanding vehicle element associated with the shunt resistor.

A method of operating a device outage detector is provided, including: obtaining a plurality of initial current values associated with each of i shunt resistors; determining i moving average current values associated with the i shunt resistors, respectively, based on the plurality of initial current values; for each of the i shunt resistors, obtaining $i^{th}$ instantaneous current value associated with an $i^{th}$ shunt resistor after determining the moving average current value; obtaining an $i^{th}$ instantaneous voltage value associated with the $i^{th}$ shunt resistor after determining the moving average current value; determining whether the $i^{th}$ instantaneous current value is below an $i^{th}$ lower current threshold; determining whether the instantaneous current value is above an $i^{th}$ upper current threshold when the $i^{th}$ instantaneous current value is not below the $i^{th}$ lower current threshold; determining whether the $i^{th}$ instantaneous voltage is zero when the $i^{th}$ instantaneous current value is below the $i^{th}$ lower current threshold; reporting a short circuit on a branch associated with the $i^{th}$ shunt resistor when the $i^{th}$ instantaneous current is above the $i^{th}$ upper current threshold; reporting an open circuit on the branch associated with the $i^{th}$ shunt resistor when the $i^{th}$ instantaneous voltage is zero; and updating the $i^{th}$ moving average current value based on the $i^{th}$ instantaneous current value and the $i^{th}$ moving average current value, wherein i is an integer greater than one.

The method may further include: obtaining one or more initial voltage values associated with the plurality of shunt resistors; and determining a moving average voltage value based on the one or more initial voltage values.

The method may further include: recording the $i^{th}$ instantaneous current value and the $i^{th}$ instantaneous voltage value.

Each shunt resistor may be connected to one of a plurality of branches of a wiring harness leading to at least one of the plurality of vehicle elements.

The vehicle elements may be lights.

The instantaneous voltage value may be determined by a voltage divider.

The $i^{th}$ lower threshold value may be equal to the $i^{th}$ moving average current value minus an $i^{th}$ adjustment value.

The $i^{th}$ adjustment value may be less than a current draw of the least demanding vehicle element associated with the shunt resistor.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention. These drawings are not necessarily drawn to scale.

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Harness System

Figure 1:
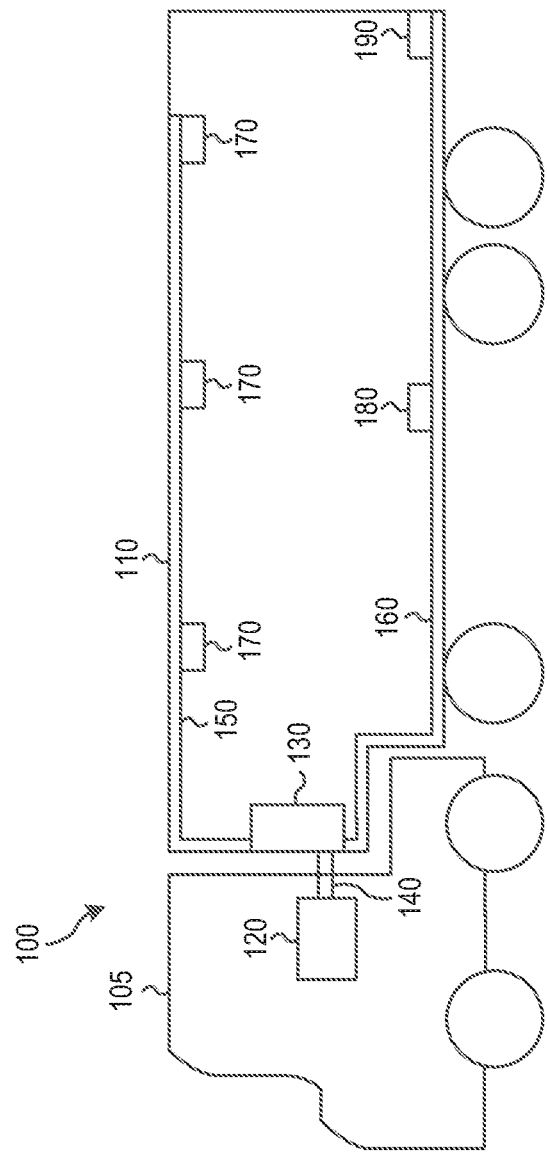
FIG. 1 is a diagram of a tractor-trailer with a lighting outage detector attached to a harness system according to disclosed embodiments.
Figure 2:
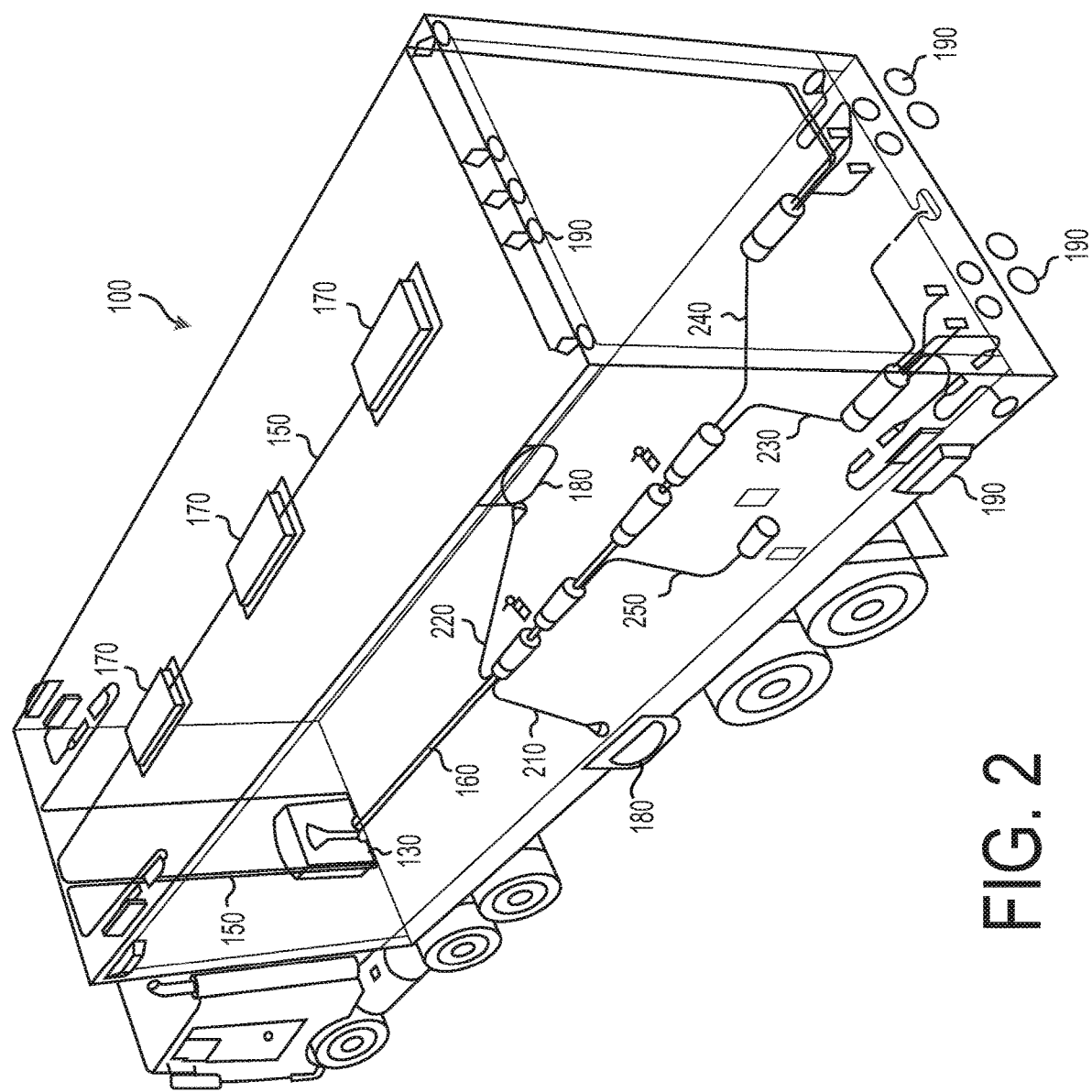
FIG. 2 is another diagram of a tractor-trailer with a lighting outage detector attached to a harness system according to disclosed embodiments.

FIGS. 1 and 2 are diagrams of a tractor-trailer 100 with a lighting outage detector attached to a harness system according to disclosed embodiments. As shown in FIGS. 1 and 2, a tractor-trailer 100 includes a cab 105 and a trailer 110.

The cab 105 is a conventional cab for pulling a trailer 110 and includes a power box and controller 120 that provides power to the trailer 110 and control signals for operating lights 170, 180, 190 in the trailer 110.

The trailer 110 is a conventional 12-wheel trailer and includes a nose box 130, located in the front of the trailer 110 that communicates with the power box and controller 120 via signal and power lines 140. The nose box 130 is also connected to an upper wiring harness 150 that runs along the top inside of the trailer 110, and a main wiring harness 160 that runs along the bottom of the trailer 110.

The power box and controller 120 can include a microprocessor and a device for providing DC power to the lights and other powered devices in the trailer 110.

The nose box 130 can be located in the front of the trailer 110 to provide for easier access by the cab 105.

The signal and power lines 140 can be any suitable lines for carrying data signals and power.

The upper wiring harness 150 is connected to one or more dome lights 170 inside the trailer 110, which are used to light the inside of the trailer 110. The upper wiring harness 150 provides power and control signals to the one or more dome lights 170. Although the upper wiring harness 150 is disclosed as having a single branch, in alternate embodiments it could have multiple branches that connect to multiple lights. These lights could include dome lights 170 or other lights on the inside or outside of the trailer 110. For example, the upper harness could have a branch that connects to upper outside lighting on the trailer 110.

The main wiring harness 160 has a plurality of branches 210, 220, 230, 240, 250 including side branches 210, 220 that connect to side lighting 180 and back branches 230, 240 that connect to rear lighting 190. The main wiring harness 160 and its branches 210, 220, 230, 240 provide power and control signals to the various side lights and back lights 180, 190. These lights can include tail lights, brake lights, turn lights, reverse lights, clearance lights, sidelights, or any other lights that are desired or required. Although four branches are disclosed in this embodiment, this is by way of example only. Alternate embodiments of the main harness can have more or fewer branches.

In various embodiments, the upper wiring harness 150 and the main wiring harness 160 can have additional branches that provide power and control signals to non-lighting elements in the trailer 110. The disclosed embodiment shows one such branch 250 in the main wiring harness 160 that passes to a non-lighting device. In this example, it is an anti-lock braking system (ABS), though alternate embodiments could connect alternate devices to the upper wiring harness 150 or the main wiring harness 160.

In operation, a lighting outage detector in the nose box 130 measures current and voltage going to each branch of the trailer 110 anywhere along the upper wiring harness 150 or the main wiring harness 160. The disclosed lighting outage detector then uses this sensor information to determine if a light on the circuit has failed, and how it has failed. The lighting outage detector also determines along which branch the lighting failure has occurred.

In the lighting outage detector, current is sensed by using a high-side current sensor, attached to a shunt resistor associated with each branch. Voltage is measured over the same shunt resistor and may be scaled down using a simple voltage divider. Both current and voltage sensors thus output a voltage, linearly proportional to their values, which can be read and monitored by a microcontroller in the lighting outage detector. The microcontroller then analyzes the signals, and reports fault conditions to an operator accordingly via the power box and controller 120.

Although the above disclosed embodiment shows a tractor-trailer 100, the disclosed lighting outage detector is applicable to other vehicles or even non-vehicle implementations in which a single controller coordinates multiple branches attached to multiple lights or other devices.

Device Outage Detector

Figure 3:
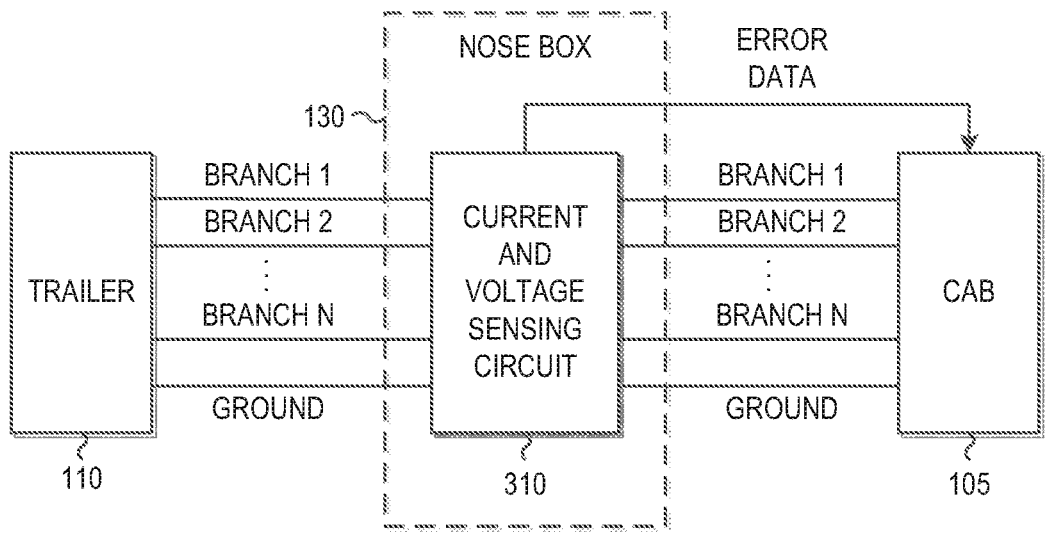
FIG. 3 is a block diagram of a device outage detector 300 according to disclosed embodiments.

FIG. 3 is a block diagram of a device outage detector 300 according to disclosed embodiments. As shown in FIG. 3, the device outage detector 300 includes a nose box 130 connected between a cab 105 and a trailer 110. As shown in FIG. 3, the nose box 130 includes a current and voltage sensing circuit 310.

The current and voltage sensing circuit 310 is connected to a plurality of branches (branch 1, branch 2, . . . branch N) in the trailer 110, which provided signals to the cab 105 from the trailer 110. The current and voltage sensing circuit 310 is also connected to a ground line to serve as a reference voltage.

In operation, the current and voltage sensing circuit 310 measures the current and voltage going to each branch, and then uses this sensor information to determine if a light on any circuit has failed, and how it has failed. The current and voltage sensing circuit 310 also determines along which branch the lighting failure has occurred, and sends this error data to the cab 105, e.g., to the power box and controller 120.

Although the disclosed embodiment relates primarily to lighting devices and lighting failures, the device outage detector 300 can be used to detect failures of any connected device.

Current and Voltage Sensing Circuit

Figure 4:
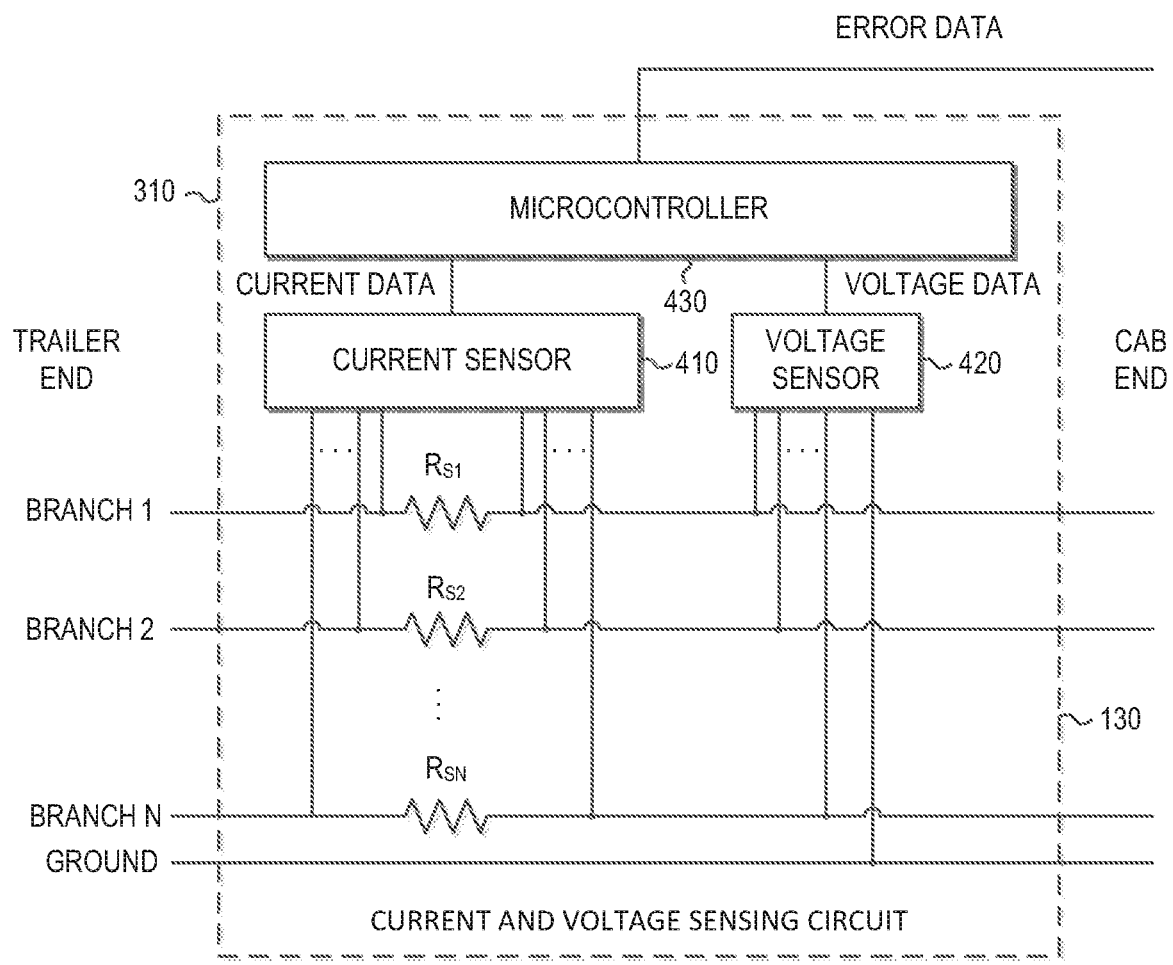
FIG. 4 is a block diagram of the current and voltage sensing circuit 310 according to disclosed embodiments.

FIG. 4 is a block diagram of the current and voltage sensing circuit 310 according to disclosed embodiments. As shown in FIG. 4, the current and voltage sensing circuit 310 includes a current sensor 410, a voltage sensor 420, and a microcontroller 430.

The current sensor 410 is connected to a plurality of shunt resistors $R_{S1}$, $R_{S2}$, . . . , $R_{SN}$, located on the plurality of branches, respectively, and operates to detect a current passing through each shunt resistor $R_{S1}$, $R_{S2}$, . . . , $R_{SN}$. In the disclosed embodiment this is achieved by using a high-side current sensor, which outputs a voltage corresponding to the detected current. However, alternate embodiments could use alternate current detecting devices as the current sensor 410.

The voltage sensor 420 is connected to each shunt resistor $R_{S1}, R_{S2}, \ldots, R_{SN}$, and to ground, and operates to detect a voltage across each shunt resistor $R_{S1}, R_{S2}, \ldots, R_{SN}$. In the disclosed embodiment this voltage is scaled down using a simple voltage divider. However, in alternate embodiments such scaling may be omitted.

The microcontroller 430 receives current data from the current sensor 410 and voltage data from the voltage sensor 420 and determines whether there has been an error along any of the branches, and if so what that error was (e.g., short circuit or open circuit). This error data is then transmitted to the cab 105 for further processing.

Although in the current embodiment, the determination of whether there has been an error, and what that error was, is determined in the current and voltage sensing circuit, this is not required. Alternate embodiments could send the current data and voltage data from the nose box to the cab 105, where the power box and controller 120 could determine whether an error occurred and what the error was.

Method of Operation

Figure 5:
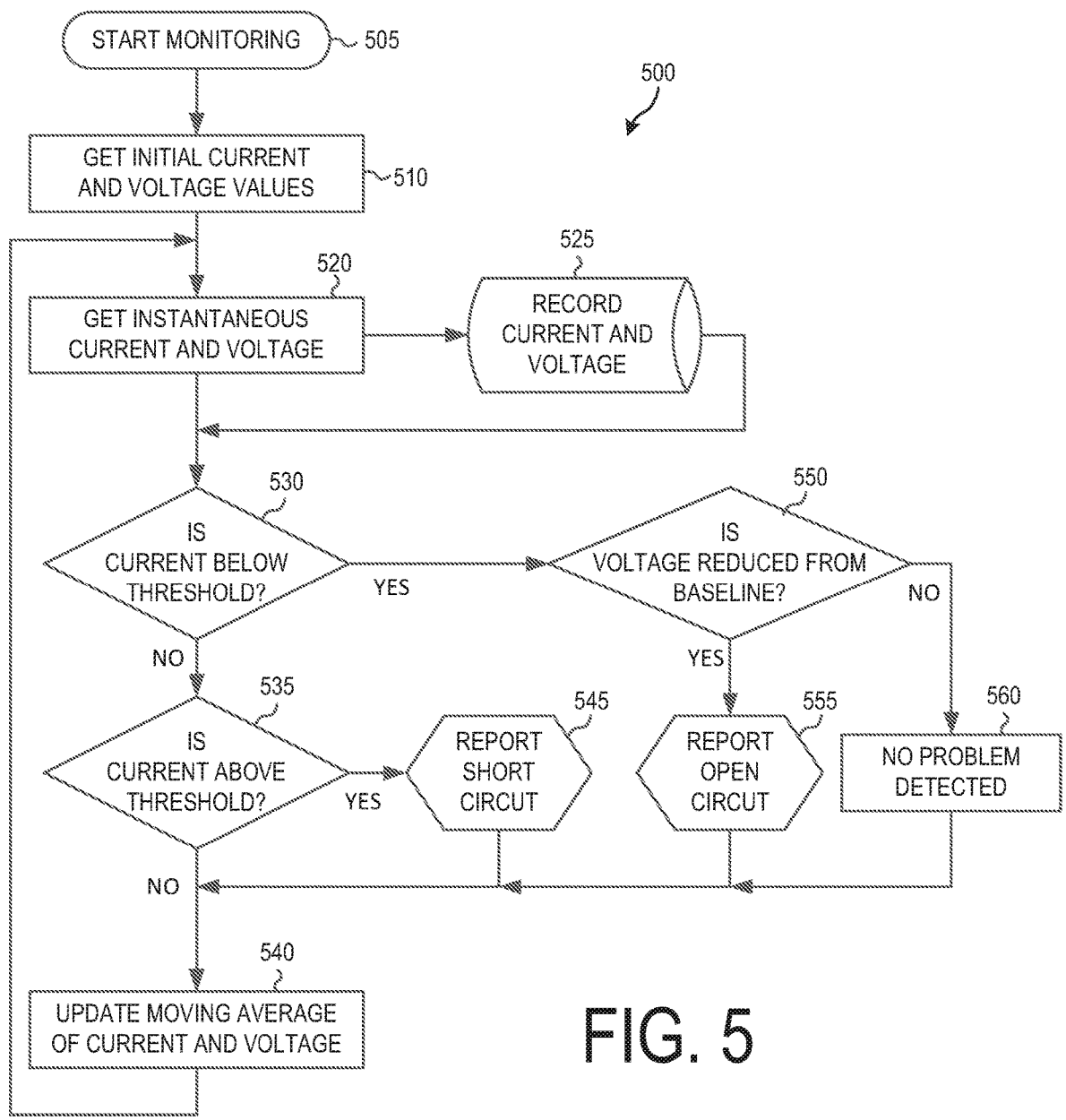
FIG. 5 is a flowchart of the operation of the current and voltage sensing circuit according to disclosed embodiments.

FIG. 5 is a flowchart of the operation of the current and voltage sensing circuit. As shown in FIG. 5, operation begins when the current and voltage sensing circuit 310 starts monitoring the various branches. (505) For ease of disclosure, the process is described with respect to a single branch. However, in operation, the same process is performed for each branch.

Once the system has started, the current and voltage sensing circuit 310 obtains a current and voltage measurement across the respective shunt resistors $R_{S1}, R_{S2}, \ldots, R_{SN}$, using the current sensor 410 and the voltage sensor 420, to form initial average values for current and voltage. (510) these initial average values for current and voltage are stored as moving average values for later use.

The current and voltage sensing circuit 310 then obtains instantaneous current and voltage measurements across the respective shunt resistor $R_{S1}, R_{S2}, \ldots, R_{SN}$ using the current sensor 410 and the voltage sensor 420. (520)

The current and voltage sensing circuit 310 can record the instantaneous current and voltage to a separate memory if desired. (525) However, this operation is not necessary to the process.

The current and voltage sensing circuit 310 then compares the instantaneous current measurement to a lower current threshold value for each branch that is based on the respective moving average current measurement for that branch. (530) In the disclosed embodiment, this lower current threshold value is equal to the moving average current measurement minus an adjustment value. Typically, this adjustment value would be less than the current to draw of the least demanding device in the respective branch (e.g., approximately 10 mA). However, a different adjustment value could be chosen for alternate embodiments. Nevertheless, it is important to note that the adjustment value can vary from branch to branch.

If the instantaneous current is not below the lower current threshold, then the current and voltage sensing circuit 310 determines whether the instantaneous current measurement is above an upper current threshold value that is based on the moving average current. (535) In the disclosed embodiment, this upper current threshold value is equal to the moving average current measurement, plus the adjustment value.

If the instantaneous current is not above the upper current threshold value, then no problem is detected and the moving average of the current and voltage are both updated based on the instantaneous current value and the instantaneous voltage value. (540)

If, however, the instantaneous current is above the upper current threshold value, then it is determined that a device along the respective branch has suffered a short circuit. Such a short circuit is reported to the cab 105 through the current and voltage sensing circuit 310. (545)

If the instantaneous current is below the lower current threshold, the current and voltage sensing circuit 310 determines whether the instantaneous voltage across the respective shunt resistor $R_{S1}, R_{S2}, \ldots, R_{SN}$ is zero. (550)

If the instantaneous voltage is reduced from the baseline value by a finite value, then it is determined that the device along the respective branch has suffered an open circuit. Such an open circuit is reported to the cab 105 through the current and voltage sensing circuit 310. (555)

If, however the instantaneous voltage is not reduced from the baseline value by a finite value, then it is determined that the no problem is detected along the respective branch. (560)

Then, whether a short circuit has been reported (545), an open circuit has been reported (555), or no problem has been detected (560), the moving average of the current and voltage are both updated based on the instantaneous current value in the instantaneous voltage value. (540)

Once the moving average of the current the voltage are both updated, the process returns to determining a new instantaneous current and voltage (520), and processing of these new instantaneous values proceeds as noted above.

In this way, the current and voltage sensing circuit 310 can provide a warning whenever there is a short circuit or an open circuit on any of the branches of the upper harness 150 or the main harness 160. The current and voltage sensing circuit 310 can also provide an indication of which branch the short circuit or open circuit occurred on.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A device outage detector, comprising:
   a microcontroller;
   a plurality of shunt resistors, each connected to at least one of a plurality of vehicle elements;
   a current sensor configured to measure a plurality of instantaneous currents passing through the plurality of shunt resistors, respectively, and configured to generate a plurality of instantaneous current values; and
   a voltage sensor, separate from the current sensor, configured to measure a plurality of instantaneous voltages across the plurality of shunt resistors, respectively, and configured to generate a plurality of instantaneous voltage values different from the plurality of instantaneous current values, wherein the microcontroller is configured to issue a warning for a given shunt resistor if its corresponding instantaneous current is below a first threshold value and its instantaneous voltage is zero, and the microcontroller is configured to issue a warning for the given shunt resistor if its corresponding instantaneous current is above a second threshold value.

2. The device outage detector of claim 1, wherein the vehicle elements are lights.

3. The device outage detector of claim 1, wherein each shunt resistor is connected to one of a plurality of branches of a wiring harness leading to at least one of the plurality of vehicle elements.

4. The device outage detector of claim 1, wherein the voltage sensor is a voltage divider.

5. The device outage detector of claim 1, wherein the microcontroller is configured to determine whether the instantaneous voltage of the given shunt resistor is zero after determining whether the instantaneous current of the given shunt resistor is below the first threshold value.

6. A device outage detector, comprising:
a microcontroller;
a plurality of shunt resistors, each connected to at least one of a plurality of vehicle elements;
a current sensor configured to measure a plurality of instantaneous currents passing through the plurality of shunt resistors, respectively; and
a voltage sensor configured to measure a plurality of instantaneous voltages across the plurality of shunt resistors, respectively, wherein the microcontroller is configured to issue a warning for a given shunt resistor if its corresponding instantaneous current is below a first threshold value and its instantaneous voltage is zero, the microcontroller is configured to issue a warning for the given shunt resistor if its corresponding instantaneous current is above a second threshold value, and the first threshold value is equal to a moving average current minus an adjustment value.

7. The device outage detector of claim 6, wherein the adjustment value varies with each shunt resistor.

8. The device outage detector of claim 6, wherein the adjustment value is less than a current draw of the least demanding vehicle element associated with the shunt resistor.

9. The device outage detector of claim 6, wherein the microcontroller is configured to determine whether the instantaneous voltage of the given shunt resistor is zero after determining whether the instantaneous current of the given shunt resistor is below the first threshold value.

10. A method of operating a device outage detector, comprising:

obtaining a plurality of initial current values associated with each of i shunt resistors;

determining i moving average current values associated with the i shunt resistors, respectively, based on the plurality of initial current values;

for each of the i shunt resistors, obtaining an $i^{th}$ instantaneous current value associated with an $i^{th}$ shunt resistor after determining the moving average current value;

obtaining an $i^{th}$ instantaneous voltage value associated with the $i^{th}$ shunt resistor after determining the moving average current value;

determining whether the $i^{th}$ instantaneous current value is below an $i^{th}$ lower current threshold;

determining whether the instantaneous current value is above an $i^{th}$ upper current threshold when the $i^{th}$ instantaneous current value is not below the $i^{th}$ lower current threshold;

determining whether the $i^{th}$ instantaneous voltage is zero when the $i^{th}$ instantaneous current value is below the $i^{th}$ lower current threshold;

reporting a short circuit on a branch associated with the $i^{th}$ shunt resistor when the $i^{th}$ instantaneous current is above the $i^{th}$ upper current threshold;

reporting an open circuit on the branch associated with the $i^{th}$ shunt resistor when the $i^{th}$ instantaneous voltage is zero; and updating the $i^{th}$ moving average current value based on the $i^{th}$ instantaneous current value and the $i^{th}$ moving average current value, wherein i is an integer greater than one.

11. The method of claim 10, further comprising
obtaining one or more initial voltage values associated with the plurality of shunt resistors; and
determining a moving average voltage value based on the one or more initial voltage values.

12. The method of claim 10, further comprising
recording the $i^{th}$ instantaneous current value and the $i^{th}$ instantaneous voltage value.

13. The method of claim 10, wherein each shunt resistor is connected to one of a plurality of branches of a wiring harness leading to at least one of a plurality of vehicle elements.

14. The method of claim 13, the vehicle elements are lights.

15. The device of claim 10, wherein the instantaneous voltage value is determined by a voltage divider.

16. The device of claim 10, wherein the $i^{th}$ lower current threshold value is equal to the $i^{th}$ moving average current value minus an $i^{th}$ adjustment value.

17. The device of claim 16, wherein the $i^{th}$ adjustment value is less than a current draw of a least demanding vehicle element associated with the shunt resistor.

18. The device of claim 10, wherein the determining of whether the $i^{th}$ instantaneous voltage is zero occurs after the determining of whether the $i^{th}$ instantaneous current value is below the $i^{th}$ lower current threshold.

* * * * *